US006838942B1

United States Patent
Somerville et al.

(10) Patent No.: US 6,838,942 B1
(45) Date of Patent: Jan. 4, 2005

(54) EFFICIENT CLASS-G AMPLIFIER WITH WIDE OUTPUT VOLTAGE SWING

(75) Inventors: Thomas A. Somerville, Tempe, AZ (US); Klaas Wortel, Phoenix, AZ (US)

(73) Assignee: Standard Microsystems Corporation, Hauppauge, NY (US)

(*) Notice: Subject to any disclaimer, the term of this patent is extended or adjusted under 35 U.S.C. 154(b) by 7 days.

(21) Appl. No.: 10/622,051

(22) Filed: Jul. 17, 2003

(51) Int. Cl.$^7$ ............................................. H03F 3/04
(52) U.S. Cl. ..................................... 330/297; 330/257
(58) Field of Search ............................... 330/297, 127, 330/298, 207 P, 253, 257, 261, 51

(56) References Cited

U.S. PATENT DOCUMENTS

| | | | |
|---|---|---|---|
| 4,319,199 A | | 3/1982 | Sunderland |
| 4,721,919 A | | 1/1988 | LaRosa et al. |
| 5,389,894 A | | 2/1995 | Ryat |
| 5,515,006 A | | 5/1996 | Chan |
| 5,663,681 A | * | 9/1997 | Botti et al. ............... 330/51 |
| 5,939,943 A | | 8/1999 | Roza |
| 6,118,341 A | * | 9/2000 | Huijsing et al. .......... 330/258 |
| 6,417,733 B1 | | 7/2002 | Corsi et al. |
| 6,538,514 B2 | | 3/2003 | Harvey |
| 6,614,310 B2 | | 9/2003 | Quarfoot et al. |
| 6,664,857 B2 | * | 12/2003 | Ausserlechner ......... 330/297 |

OTHER PUBLICATIONS

"Class–G Power Amplifiers," http://www.dself.dsl.pipex.com/ampins/classg/g.htm, Page updated Feb. 7, 2002, 2 pages.
Van der Zee, "High Efficiency Audio Power Amplifiers: design and practical use," http://doc.utwente.nl/fid/1351, 1999, 128 pages.

* cited by examiner

Primary Examiner—Henry Choe
(74) Attorney, Agent, or Firm—Meyertons Hood Kivlin Kowert & Goetzel, P.C.; Jeffrey C. Hood

(57) ABSTRACT

Various embodiments of methods and apparatus for an amplifier with wide output voltage swing are disclosed. The amplifier may include multiple output stages, each associated with a distinct supply voltage. Each output stage may contribute current to the output of the amplifier over a range of amplifier output voltages and these ranges may overlap. Each output stage may contribute current until the amplifier output voltage reaches the supply voltage associated with that output stage. The amplifier output may be as great as the largest supply voltage minus a drop equal to Rdson for an output transistor multiplied by the output current. In a CMOS implementation, this voltage drop may be approximately 0.15V. When the amplifier output voltage is close to the supply voltage associated with an output stage, both that output stage and the output stage associated with the next highest supply voltage may contribute to the amplifier output.

32 Claims, 7 Drawing Sheets

EFFICIENT CLASS-G AMPLIFIER WITH WIDE OUTPUT VOLTAGE SWING

BACKGROUND OF THE INVENTION

1. Field of the Invention

This invention relates to integrated circuits, and more particularly, to amplifiers implemented as integrated circuits.

2. Description of the Related Art

The basic function of an amplifier is to produce and output signal whose power is a multiple of the power of an input signal. In many applications it is desirable that the output waveform faithfully reproduce the shape of the input signal while magnifying its voltage and/or current in a linear fashion. Traditionally, amplifiers designed for these types of applications have been configured for class A operation.

In an amplifier designed for class A operation, both output devices conduct continuously for the entire cycle of signal swing, or the bias current flows in the output devices at all times. The key ingredient of class A operation is that both devices are always on. There is no condition where one or the other is turned off. Because of this, class A amplifiers in reality are not complementary designs. They are single-ended designs with only one type polarity output devices. They may have "bottom side" transistors but these are operated as fixed current sources, not amplifying devices.

Since a class A amplifier operates from only one power supply, the voltage level of the supply must be somewhat greater than the level of the peak output specified. Therefore, during times in which the input signal is very small, the difference between the amplitude of the output signal and the voltage of the power supply will be large. The amount of non-usable power to be dissipated in the output devices is the aforementioned voltage difference multiplied by the output current. Even in those instances where the output is at its maximum level, there will still be a non-negligible voltage drop across the output devices and corresponding level of non-usable power dissipated in the devices.

Consequently class A is the most inefficient of all power amplifier designs, averaging only around 20% (meaning it consumes about 5 times as much power from the source as it delivers to the load!) Thus class A amplifiers are large, heavy and run very hot. All this is due to the amplifier constantly operating at full power. The positive effect of all this is that class A designs are inherently the most linear, with the least amount of distortion.

In order to increase the efficiency of an amplifier while maintaining a high degree of linearity, a class G design may be employed. Class G operation involves changing the power supply voltage from a lower level to a higher level when larger output swings are required. There have been several ways to do this. The simplest involves a single class AB output stage that is connected to two power supply rails by a diode, or a transistor switch. The design is such that under most circumstances, the output stage is connected to the lower supply voltage, and automatically switches to the higher rails for large signal peaks. Another approach uses two class AB output stages, each connected to a different power supply voltage, with the magnitude of the input signal determining the signal path. Using two power supplies improves efficiency enough to allow significantly more power for a given size and weight.

Typically, class G amplifier implementations employ current blocking diodes to prevent current from being driven into a lower voltage supply when the amplifier output exceeds the lower supply voltage. This effectively protects the lower voltage power supplies, but also limits the efficiency of their contribution to the amplifier output. The power dissipated in the diode will be the voltage drop across the diode times the output current. This power loss will occur any time a lower voltage supply is contributing to the output of the amplifier. In addition, each output stage normally includes a power device to control the flow of current to the load. This device dissipates power equal to the difference between the supply voltage and the amplifier output multiplied by the load current. Again, this power will be wasted any time the supply is contributing to the amplifier output.

When a power supply is contributing maximum current to the amplifier output, the output device will typically be saturated and drop a few tenths of a volt. When added to the diode drop for a lower voltage supply, the total difference between the supply voltage and the amplifier output may be around one volt. While such a voltage drop and corresponding inefficiency may be acceptable in a relatively high voltage amplifier design where the output is several tens of volts, integrated circuit amplifiers for low-power applications are typically designed to operate with minimum supply voltages below two volts and such a drop in output stage voltage would limit the amplifier's maximum efficiency to less than fifty percent. Therefore, a more efficient design for a class G amplifier may be desirable.

SUMMARY

Various embodiments of methods and apparatus for an amplifier with wide output voltage swing are disclosed. The amplifier may include multiple output stages, each associated with a distinct supply voltage. Each output stage may contribute current to the output of the amplifier over a range of amplifier output voltages and these ranges may overlap. Each output stage may contribute current until the amplifier output voltage reaches the supply voltage associated with that output stage. The amplifier output may be as great as the largest supply voltage minus a drop equal to Rdson for an output transistor multiplied by the output current. In a CMOS implementation, this voltage drop may be approximately 0.15V. When the amplifier output voltage is close to the supply voltage associated with an output stage, both that output stage and the output stage associated with the next highest supply voltage may contribute to the amplifier output.

As the amplifier input voltage increases from zero, the output stage associated with the lowest supply voltage may supply all of the amplifier output current until the amplifier output voltage reaches a level that is delta V below the lowest supply voltage, where delta V may be a few tenths of a volt and may be set by ratio of channel geometries of transistors in the output stage controller. At this point the output stage associated with the next highest supply voltage may begin to contribute current to the output of the amplifier. Both output stages may continue to contribute current to the amplifier output until the amplifier output voltage reaches the level of the lowest supply voltage. At this point the output stage controller may assert a signal that causes the output of the output stage associated with the lowest supply voltage to be coupled to the input for that stage through an analog switch, thus isolating the lowest supply voltage from the amplifier output when the amplifier output voltage is above the lowest supply voltage.

When the amplifier output voltage is above the lowest supply voltage the output stage associated with the next highest supply voltage may contribute all the current to the amplifier output. When the amplifier output rises to within delta V of the supply voltage for this output stage the output stage associated with the next highest supply voltage may begin to contribute current to the amplifier output. The transition regions in which two output stages whose supply voltages are adjacent share the current load of the amplifier may begin at delta V below each supply voltage. At this voltage, the output stage associated with the supply voltage may be supplying the preponderance of the amplifier output current, while the output stage associated with the next highest supply voltage may supply only negligible current. As the output voltage of the amplifier increases through delta V, the brunt of the amplifier output current may switch sources, so that by the time the amplifier output voltage reaches the supply voltage, the output stage associated with the next highest supply voltage may bear the complete burden. This transition mechanism may serve to reduce noise associated with switching the current supply between output stages.

The transitioning of amplifier output load between output stages may be repeated for each pair of output stages included in the amplifier. A larger number of output stages may correspond to a greater amplifier efficiency. In one embodiment, an amplifier may be implemented as an IC using CMOS technology and delta V may be designed to be approximately 0.3 V. This IC may be used to drive a cooling fan in a personal computer environment and may use supply voltages of 2.5 V, 3.3 V, and 5 V that are common in this type of system. Each output stage of the amplifier may provide a voltage gain greater than unity.

BRIEF DESCRIPTION OF THE DRAWINGS

Other aspects of the invention will become apparent upon reading the following detailed description and upon reference to the accompanying drawings in which.

Figure 1:
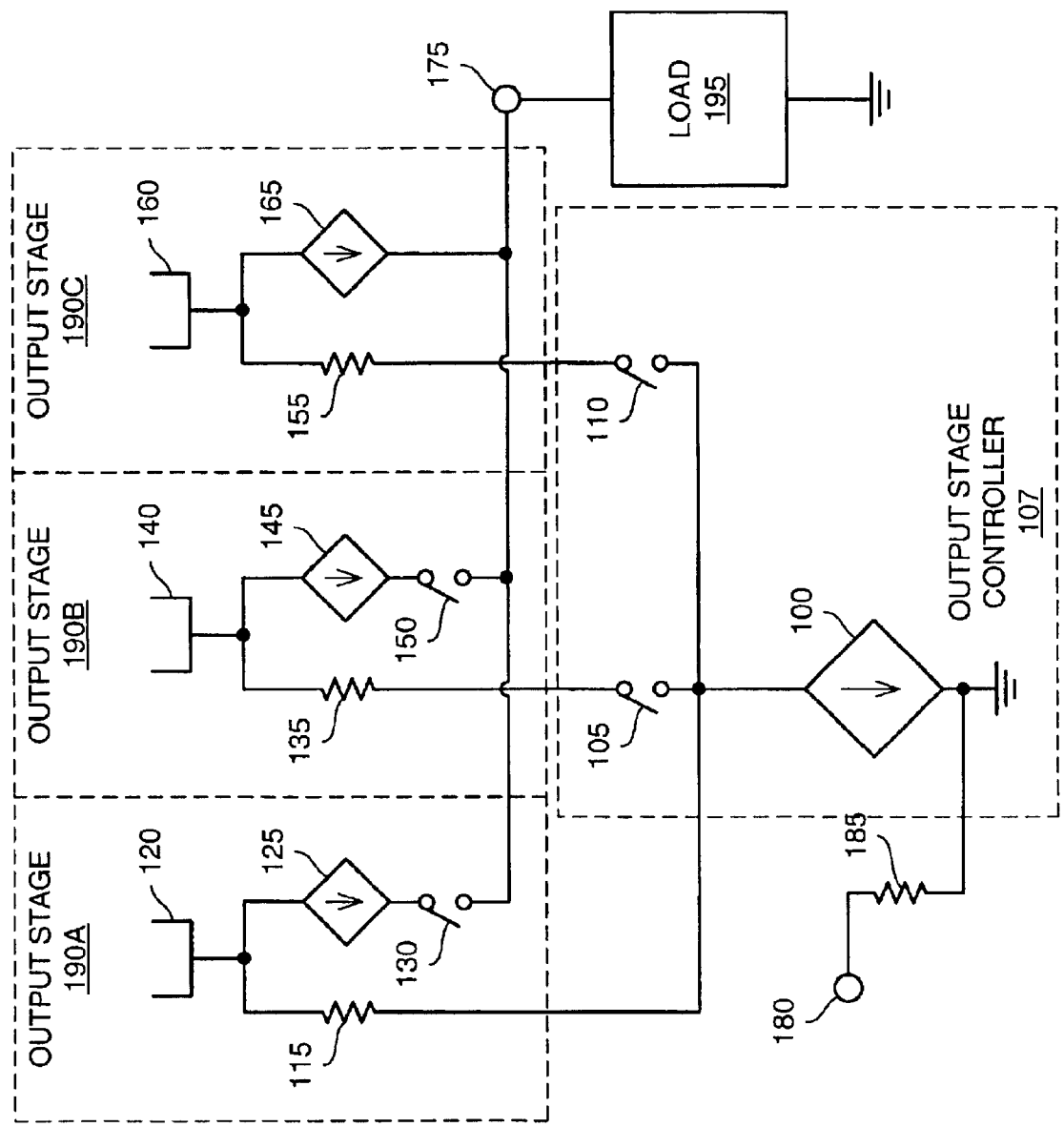
FIG. 1 shows a diagram of a class G amplifier, according to one embodiment.

While the invention is susceptible to various modifications and alternative forms, specific embodiments thereof are shown by way of example in the drawings and will herein be described in detail. It should be understood, however, that the drawings and description thereto are not intended to limit the invention to the particular form disclosed, but, in the contrary, the invention is to cover all modifications, equivalents, and alternatives falling with the spirit and scope of the present invention as defined by the appended claims.

DETAILED DESCRIPTION OF EMBODIMENTS

FIG. 1 shows a diagram of a class G amplifier, according to one embodiment. Voltage-controlled current sink 100 may draw current from the control sections of the output stages 190 in proportion to the amplifier input voltage 180. For example, output stage 190A may be associated with the lowest power supply voltage 120 of any output stage. When current sink 100 begins to draw current in response to input voltage 180, switches 105 and 110 associated with the control sections of output stages 190B and 190C respectively may be open. In this instance, all current drawn by current sink 100 may come from the control section of output stage 190A through resistor 115.

Current-controlled current source 125 may source current from the power supply of output stage 190A in proportion to the current through resistor 115. Switch 130 may be closed for amplifier output voltage 175 in the range of zero to the voltage 120 of the power supply associated with output stage 190A. Current source 125 may supply current through switch 130 to produce amplifier output voltage 175. For values of amplifier output voltage 175 below supply voltage 120 minus a small voltage increment, delta V, output stage 190A may be the only contributor to the current through amplifier load 195.

As amplifier input voltage 180 increases, current sink 100 may draw more and more current through resistor 115. Increasing current through resistor 115 may cause a proportional increase in current from source 125 through load 195, and a corresponding rise in amplifier output voltage 175. Output stage 190A may continue to source current to load 195 until the amplifier output voltage 175 reaches supply voltage 120. At this point the efficiency of supplying power to the load 195 is quite high. For example, if supply voltage 120 were 3.3V, the amplifier might be supplying current to load 195 with an efficiency of greater than 95%.

In a typical class G amplifier, when the output voltage increases to a level exceeding the capabilities of a lower voltage supply, the lower supply is disconnected from the amplifier output while the next higher voltage supply is switched in to furnish power to the load. This switching of the load between power supplies may result in glitches or dropouts in the amplifier output voltage. If the lower voltage supply switches off before the higher voltage supply comes on, there may be a momentary drop in the amplifier's output. Conversely if the lower voltage supply is not completely out of the circuit before the higher voltage supply kicks in, a voltage spike may occur at the output. Both of these conditions may result in the generation of electromagnetic noise, which could be detrimental to the function of circuitry in the proximity of the amplifier.

In order to insure smooth transitions of load current between power supplies and minimize generated noise, the amplifier of FIG. 1 establishes a transition zone for each pair of output stages 190. The transition zone may begin when the amplifier output voltage 175 increases to a level that is some small voltage, delta V, below the level of the lower supply voltage. In the case of a transition between output stages 190A and 190B, switch 105 may close when amplifier output voltage 175 reaches a level that is equal to supply voltage 120 minus delta V. When switch 105 closes, the control section of output stage 190B may start contributing current from power supply 140 through resistor 135 to current sink 100. Switch 150 may be closed, and the current through resistor 135 may cause current-controlled current source 145 to source a proportional current to load 195. At this point the current corresponding to the amplifier input voltage 180 is shared between resistors 115 and 135, and the load current is shared between current sources 125 and 145.

As amplifier output 175 increases from supply voltage 120 minus delta V, the proportion of the current through sink 100 shifts from resistor 115 to resistor 135. Likewise, the load current source may shift from 125 to 145 such that when the amplifier output reaches the lower supply voltage 120, output stage 190B is supplying the total output current for load 195. At this point, a very small amount of current may continue to flow through resistor 115, but it is insignificant relative to the current through resistor 135. This transitional sharing of the load current may insure that the amplifier output will be monotonic and linear with respect to an increasing input signal.

Once the amplifier output 175 reaches supply voltage 120, switch 130 may opened to prevent current from flowing through current source 125 in the reverse direction and damaging power supply 120. This protective feature will be described in greater detail below. As the input voltage increases, current sink 100 draws more current through resistor 135, which causes proportionally more current to be sourced from 145 through load 195 with a proportional increase in amplifier output 175. A second transition region occurs between output stages 190B and 190C beginning when the amplifier output increases to supply voltage 140 minus delta V. Note that the value for the voltage difference, delta V, for the transition between output stages 190B and 190C may be the same as or different from the voltage difference for the transition between output stages 190A and 190B. Delta V may be set by the width to length parameters of transistors included in the output stage controller 107. Delta V may be set within a range of values from 0V to 0.8V or potentially greater depending upon the specific application. In one embodiment, the value chosen for delta V may be 0.3V. Smaller values for delta V may increase the overall efficiency of the amplifier by allowing each output stage to solely contribute current to the amplifier output until the output is closer to the supply voltage of the output stage.

As previously described with regard to the transition between output stages 190A and 190B, the preponderance of current through sink 100 switches from resistor 135 to resistor 155 and as a result, the load current sourced from 145 decreases while that from 165 increases such that when the amplifier output reaches the level of supply voltage 140, the entire output current is produced by output stage 190C. Further increases in input voltage 180 result in increased current through resistor 155 with a corresponding increase in current sourced from 165 through load 195. This causes a proportionate rise in amplifier output 175 until the maximum level of supply voltage 160 minus the amplifier output current times Rdson of the output transistor is reached.

Note that the drain-to-source on resistance for output transistor implementations using current CMOS technology may be inversely proportional to the width of the channel. Therefore, the drain-to-source on resistance of the output transistors used to implement the amplifier may be reduced and amplifier efficiency increased by increasing the channel width of the transistors. Increasing the width of the channel for the output transistors may require additional IC real estate. Therefore, the desired efficiency of a CMOS implementation of the disclosed amplifier may be traded off with the amount of IC area required. Typical values of a fraction of an OHM are readily achievable for Rdson.

When the output of the amplifier reaches the level of supply voltage 160 minus approximately 0.15V, the amplifier may again be supplying the load at a high efficiency. For example, if the supply voltage 160 were 7 volts, the amplifier might supply the load current with around 98% efficiency. Although three output stages are depicted in FIG. 1, the advantages of this design are readily extensible to amplifiers with any number of supply voltages and corresponding output stages greater than or equal to two.

Figure 1A:
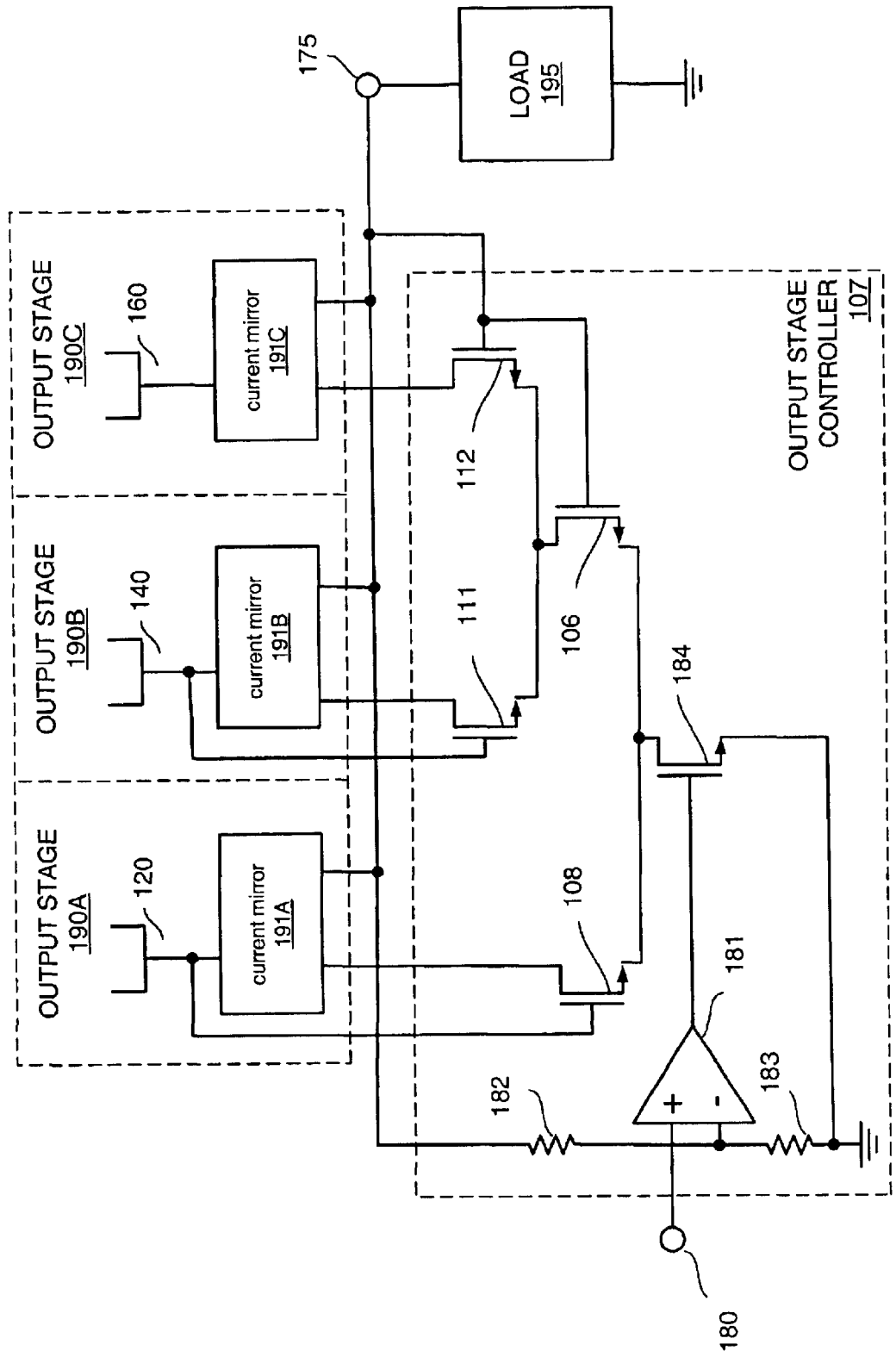
FIG. 1A shows a schematic diagram of one embodiment of a output stage controller included in a class G amplifier.

FIG. 1A presents one embodiment of the amplifier with a more detailed depiction of the output stage control functionality. Input voltage 180 may be applied to the positive input of differential amplifier 181. The output voltage 175 may be divided by resistors 182 and 183, and a portion applied to the negative input of differential amplifier 181. In this configuration, the output of the differential amplifier may drive NMOS transistor 184 so as to draw enough current from current mirrors 191 included in output stages 190 to satisfy the relationship Vout=Vin(1+R2/R1), under normal operating conditions.

If Vin starts at zero and increases monotonically, current mirror 191A may supply the total amplifier output current 175 until the amplifier output voltage reaches the level of the lowest supply voltage 120 minus delta V. Differential amplifier 181 may be driving transistor 184 to attempt to draw current from transistors 108 and 106. The gate of transistor 108 may be biased from supply voltage 120 such that it is always on and attempting to draw current from the input side of current mirror 191A. Current mirrors 191 may be configured to contribute current to Vout 175 until the point that Vout reaches the level of their input supply, as will be explained in more detail with regard to FIG. 3. Therefore, in the stated range of Vout, current mirror 191A of output stage 190A may be capable of contributing current to the amplifier output 175. On the other hand, the gate of transistor 106 is biased from Vout and therefore, no significant current may flow through transistor 106 until Vout reaches a level of voltage at the drain of transistor 184, plus the threshold voltage for transistor 106. In some embodiments, this voltage may be designed to be equal to the lowest supply voltage 120 minus delta V.

At this point transistor 111, biased by supply voltage 140 is able to draw current from current monitor 191B, but Vout is not great enough to turn on transistor 112, therefore, output stages 190A and 190B may contribute current to amplifier output 175. As Vout rises toward supply voltage 120, the proportion of output current contributed by current mirror 191B as compared with that contributed by current mirror 191A may increase rapidly due to differences in the channel geometries of transistors 108 and 106, such that when Vout is equal to supply voltage 120 minus delta V, current mirror 191A may be contributing almost the entire output current of the amplifier, but by the time Vout reaches supply voltage 120, current mirror 191B may be supplying nearly all of the output current. At this point, protective circuitry may isolate current mirror 191A from the output node of the amplifier as described below, causing current mirror 191B to provide all of the output current for the amplifier.

Current mirror 191B may supply the entire output current of the amplifier as Vout rises toward supply voltage 140. When Vout reaches supply voltage 140 minus delta V, a hand off may occur between current mirrors 191B and 191C similarly to the one previously described between current mirrors 191A and 191B. This hand off of the amplifier output current supply may be initiated when the gate bias voltage of transistor 112 reaches a level that is the NMOS threshold voltage above the voltage at the drain of transistor 106. In some embodiments, this point may be designed to be when Vout reaches a level that is delta V below supply voltage 140. At Vout equal to supply voltage 140, current mirror 191B may be isolated from the amplifier output and current mirror 191C may assume the role of sole provider of amplifier output current as Vout rises to its maximum value.

As stated previously, the methods described above for smoothly transferring the load from one output stage to another dependent on the value of the amplifier output voltage are readily extensible to embodiments of the disclosed amplifier including any number of output stages, even though FIG. 1A depicts a particular embodiment with three output stages.

Figure 2:
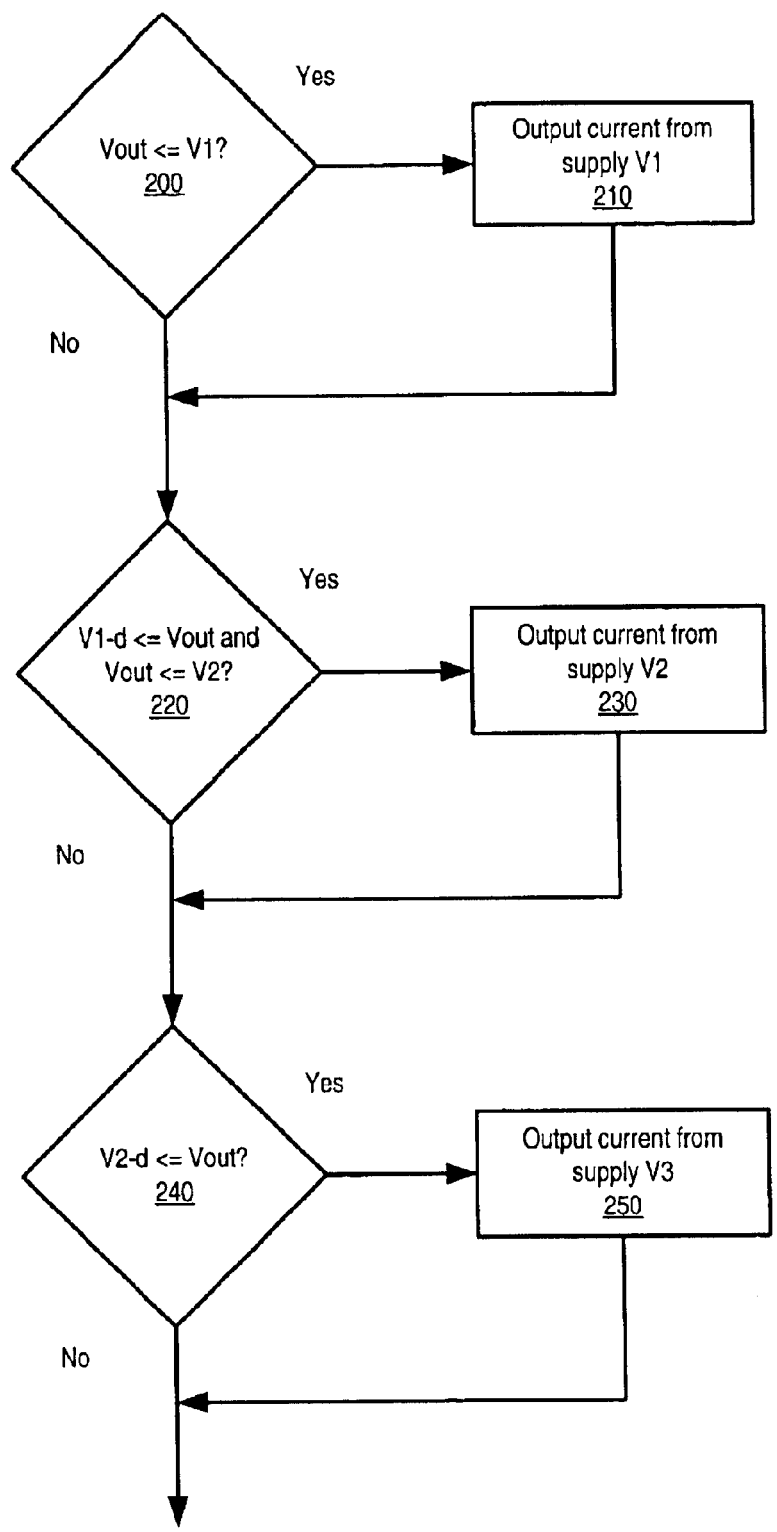
FIG. 2 is a flowchart of a method for operating a class G amplifier with three output stages, according to one embodiment.

FIG. 2 is a flowchart of a method for operating a class G amplifier with three output stages, according to one embodiment. At 200, if the amplifier output voltage, Vout, is less than the power supply voltage, V1, associated with the lowest voltage output stage, then output current may be sourced from the lowest voltage power supply. For example, if the lowest voltage power supply is 2.5 volts, then the output stage associated with this power supply may contribute output current until the output voltage reaches 2.5 volts. As shown at decision block 220, if the amplifier output voltage rises to within a small voltage difference, d, of the first output stage supply voltage, V1, then the second output stage associated with power supply V2 may start to contribute current to the amplifier output, as indicated by block 230.

During the time that the amplifier output is between V1-d and V1, both the first and second output stages may contribute current to the amplifier output. By the time the amplifier output reaches V1, the second output stage associated with power supply V2 may be supplying the total output current for the amplifier. Further increases in Vout may be brought about by corresponding increases in current output to the amplifier load from power supply V2.

When the amplifier output reaches a level of V2-d, a similar transitioning of the load current may take place between the second and third output stages associated with power supplies V2 and V3 respectively. As shown at blocks 240 and 250, when Vout rises to V2-d, power supply V3 may begin to contribute current to the output of the amplifier and this contribution may increase relative to the contribution of power supply V2 until V3 is supplying all of the amplifier output current when the amplifier output voltage reaches V2. When Vout exceeds V2, the third output stage may supply all of the amplifier output current. Note that this method may be extended to operate an amplifier with more than three output stages.

Figure 3:
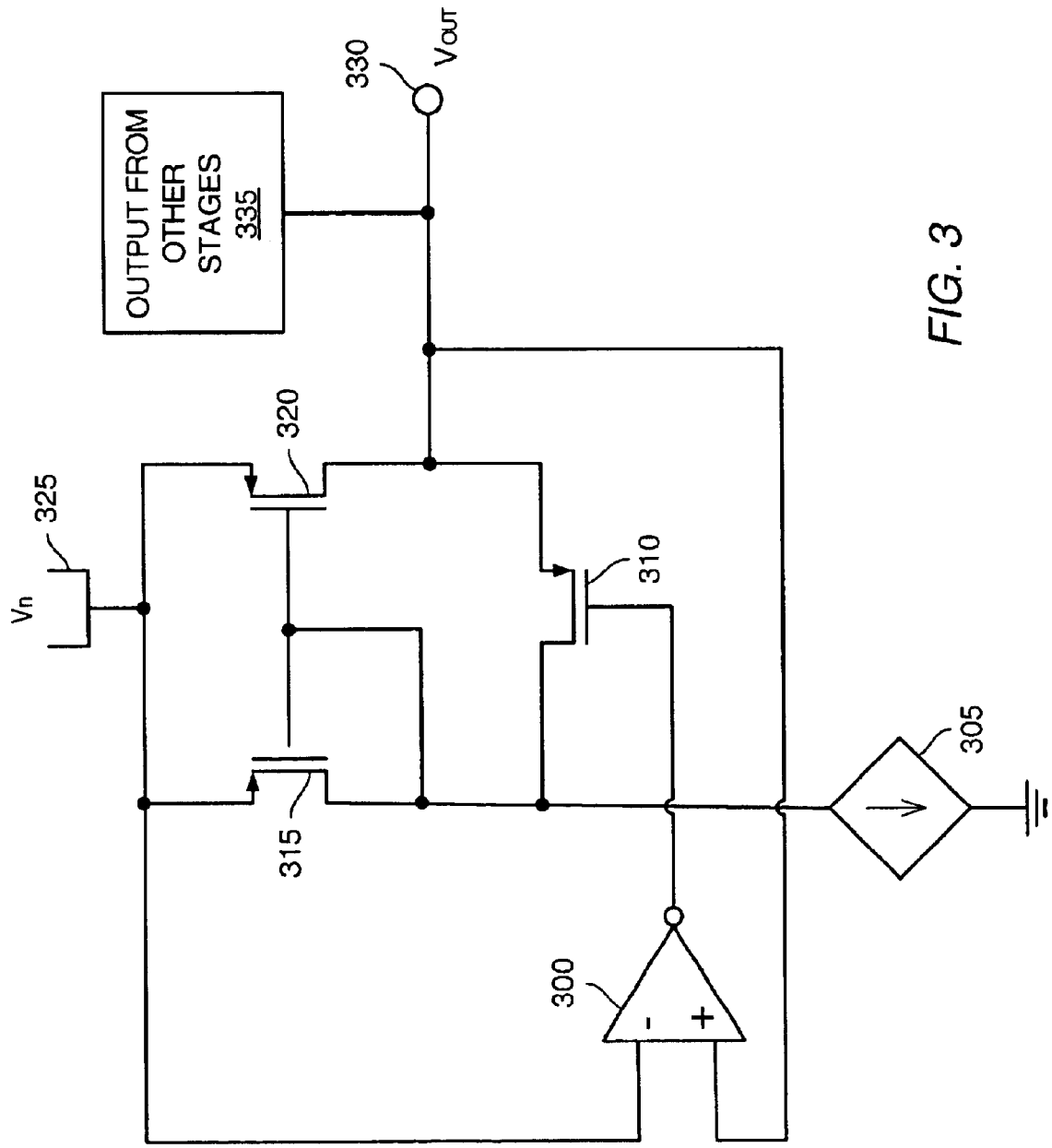
FIG. 3 illustrates a mechanism for protecting the power supply of an output stage of a class G amplifier from reverse current flow, according to one embodiment.

FIG. 3 illustrates a mechanism for protecting the power supply of an output stage of a class G amplifier from reverse current flow, according to one embodiment. Voltage-controlled current sink 305 may draw current proportional to the amplifier input voltage signal. The current through sink 305, or a portion thereof, may be drawn from power supply 325 with voltage Vn through transistor 315. Transistor 320 may source current to the output of the amplifier 330 in proportion to the current through transistor 315. This current may be combined with the output currents from the other output stages of the amplifier 335 to form the complete output current for the amplifier.

As the current sourced by this stage and the other output stages 335 of the amplifier increases, the amplifier output voltage 330 may increase. The level of the amplifier output voltage 330 is monitored with respect to the power supply voltage, Vn, for output stage, n, by comparator 300. When Vout 330 is less than Vn 325, comparator 300 may output a high voltage level to the gate of transistor 310. This high voltage level may keep transistor 310 turned off isolating Vout 330 from the gates of transistors 315 and 320. When Vout 330 is equal to or exceeds Vn 325, comparator 300 may output a low voltage level to the gate of transistor 310. This low voltage level may turn on transistor 310 and apply Vout to the gates of transistors 315 and 320. When transistor 310 is on, the gate of transistor 320 will be at a voltage level greater than or equal to the voltage level at its source. Since transistor 320 is an enhancement mode PMOSFET in FIG. 3, this bias condition may prevent current from flowing into power supply 325 when Vout 330 exceeds Vn 325.

This mechanism is significant in that it allows the power supply associated with an output stage to contribute current to the amplifier output up until the point that the amplifier output reaches the level of the power supply for that stage. In an output stage of a typical class G amplifier, a diode is used to prevent current from flowing from the amplifier output into the power supply associated with the output stage when the amplifier output exceeds the level of the supply. This limits the efficiency of the typical class G output stage because all current output from the stage must pass through the diode in addition to a gating device such as a power transistor. The combined voltage drop from the supply voltage to the amplifier output level is a minimum of about one volt in the typical case, and the power wasted in the output stage will be the one volt times the output current. For a typical low-voltage amplifier where the largest supply voltage is, for example, three volts, this wasted power may be nearly as great as the power being supplied to the load. The disclosed mechanism of FIG. 3 may reduce the power wasted in an output stage by nearly an order of magnitude.

Figure 4:
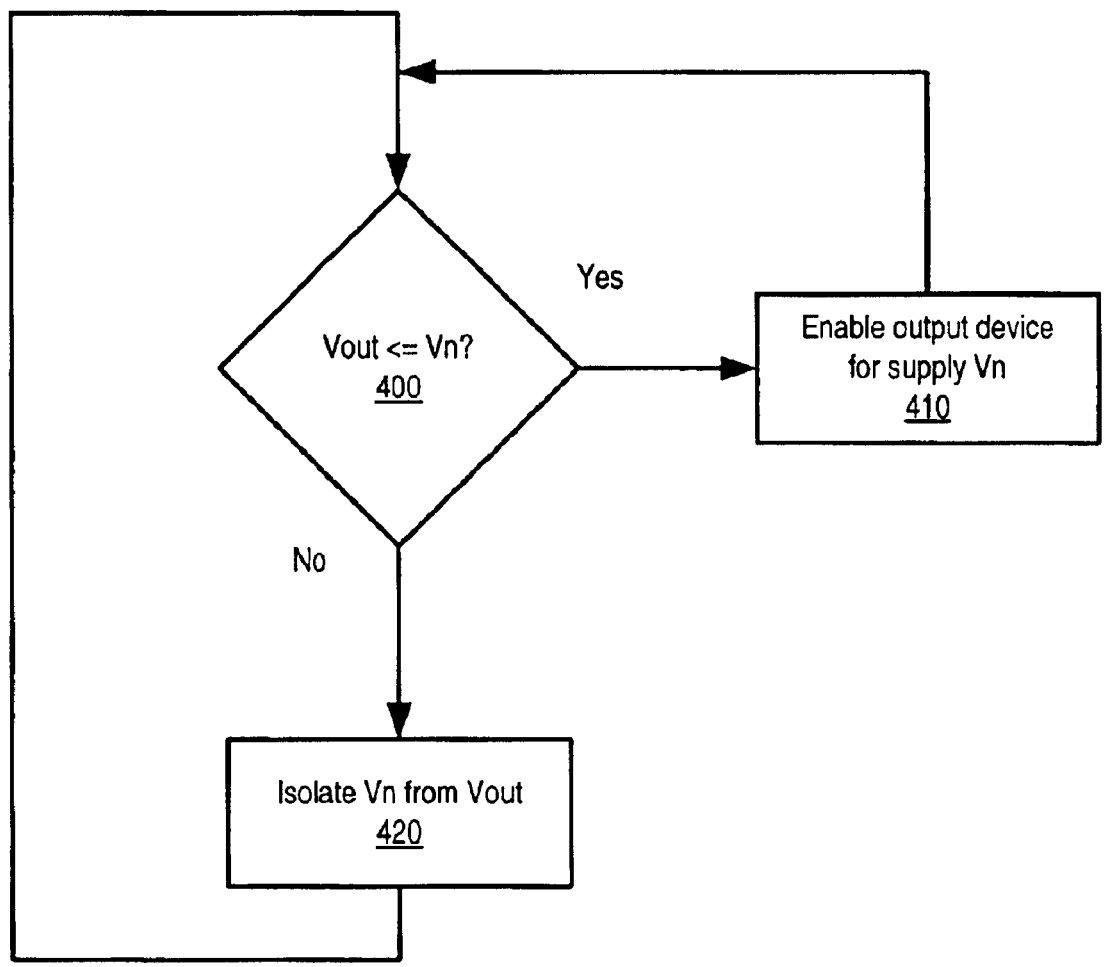
FIG. 4 is a flowchart of a method for operating an output stage of a class G amplifier, according to one embodiment.

FIG. 4 is a flowchart of a method for operating an output stage of a class G amplifier, according to one embodiment. At block 400, the amplifier output voltage may be monitored with respect to the power supply voltage, Vn, associated with a particular output stage. As long as the amplifier output voltage, Vout, remains below Vn, the output device for that output stage may be capable of sourcing current to the amplifier load and may provide the load current for amplifier output voltages in a range below Vn as described previously and indicated by block 410. When Vout surpasses Vn, the output stage's power supply may be isolated from the output of the amplifier so that no current may flow from Vout into the power supply, as illustrated at block 420. This may prevent damage to the power supply for output stage, n, by inhibiting reverse current flow into the supply.

Figure 5:
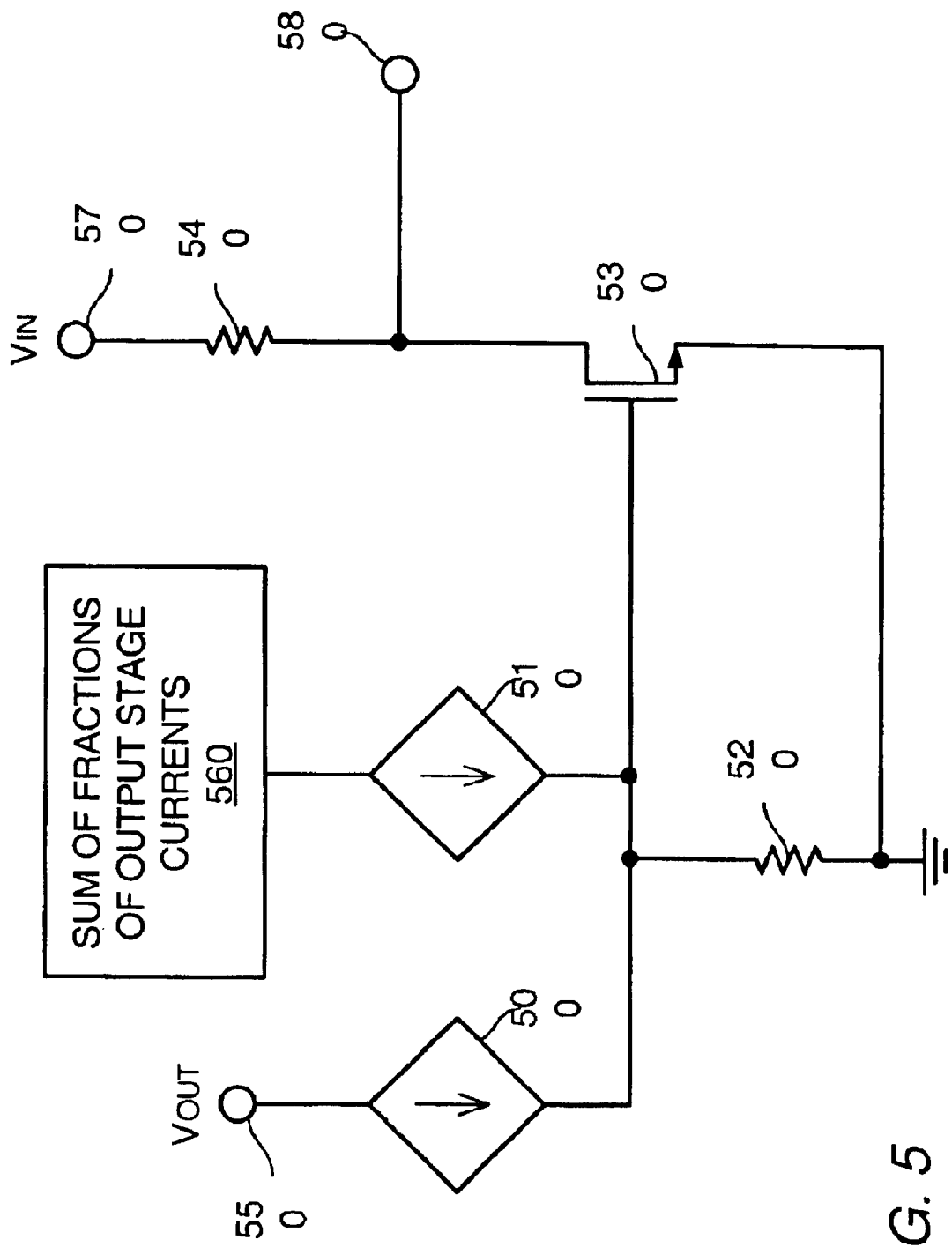
FIG. 5 illustrates circuitry for limiting the total output current of an amplifier as a function of the amplifier output voltage, according to one embodiment.

FIG. 5 illustrates circuitry for limiting the total output current of an amplifier as a function of the amplifier output voltage, according to one embodiment. Voltage-controlled current source 500 may output a current into resistor 520 that is inversely proportional to the amplifier output voltage, Vout, 550. Current-controlled current source 510 may also supply current to resistor 520. Current source 510 may output a current that is a particular fraction of the sum of the currents being output by all output stages of the amplifier. Current sources 500 and 510 may be designed such that the sum of their outputs delivered to resistor 520 is constant or nearly constant over the range of amplifier output voltage.

The current through resistor 520 may produce a voltage at the gate of transistor 530. The current through resistor 520 may be set such that the voltage produced at the gate of transistor 530 is insufficient to turn the transistor on under normal operating conditions. If the current produced by the output stages should rise disproportionately with respect to the amplifier output voltage 550, the sum of the currents from sources 500 and 510 might rise as well. This condition may be caused by a reduction in amplifier load impedance, an extreme example of which might be a short circuit of the amplifier output. Under these circumstances, the current through source 510 may rise more rapidly than the current from source 500 diminishes resulting in a net increase in the current through resistor 520. This increase in current may produce a corresponding increase in the voltage at the gate of transistor 530.

As the current through resistor 520 increases, the gate-to-source voltage of transistor 530 may also increase to the point of turning the transistor on. When transistor 530 is off, amplifier input signal 570 is applied to resistor 540 and a current 580 proportional to the input voltage is used to control the current produced by the output stages of the amplifier as described previously. When transistor 530 turns on, it shunts a portion of the input current through resistor 540 to ground. The reduction in control current 580 may produce a corresponding drop in the current produced by the amplifier output stages. This mechanism may prevent damage to the amplifier resulting from excessive output current.

Figure 6:
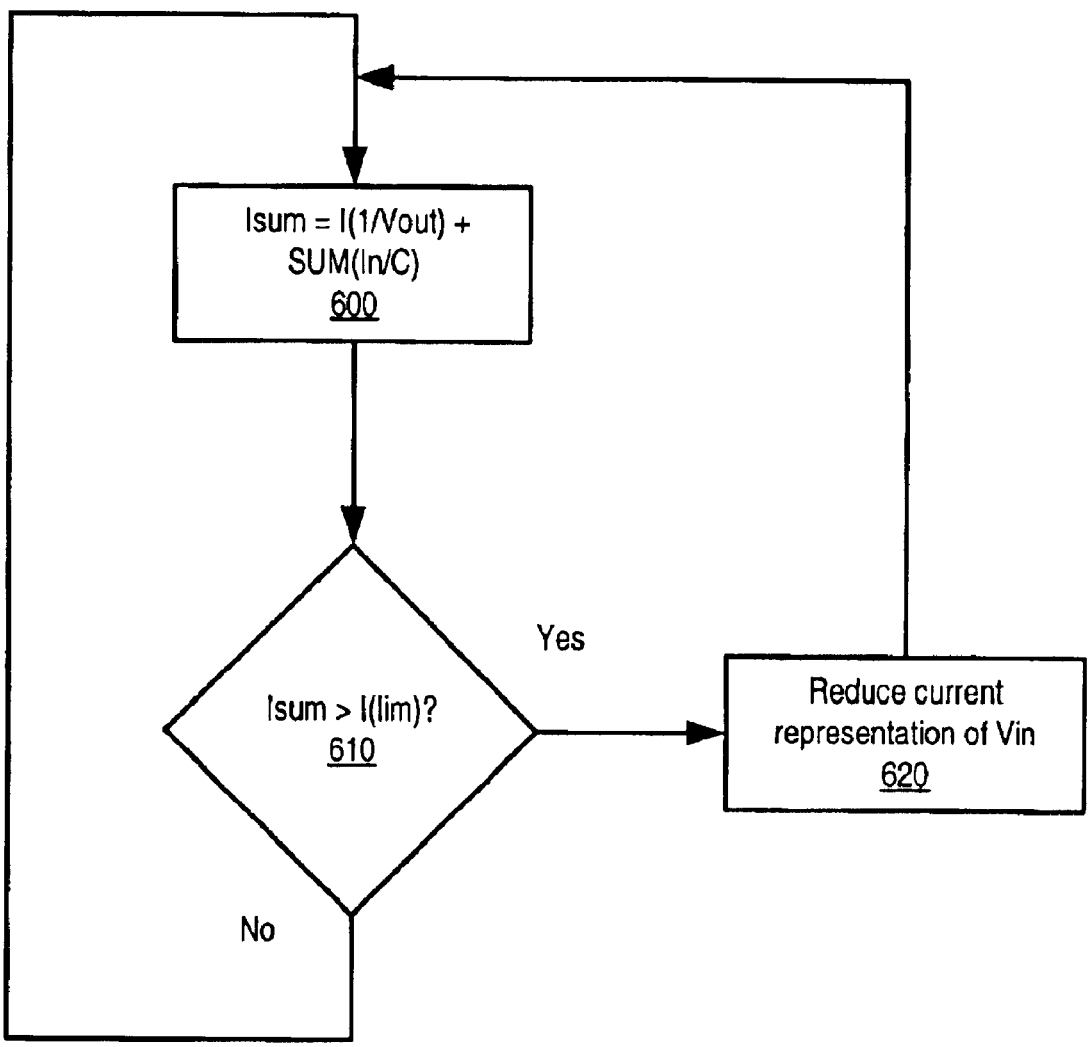
FIG. 6 is a flowchart of a method for providing output current limiting in a class G amplifier, according to one embodiment.

FIG. 6 is a flowchart of a method for providing output current limiting in a class G amplifier, according to one embodiment. At 600, a current corresponding to a fraction of the output current from stage n of the amplifier may be summed with similar fractional currents corresponding to each of the other n−1 output stages of the n-stage class G amplifier. This current is added to a current that is inversely proportional to the amplifier output voltage, Vout, to form the current Isum. As depicted in decision block 610, Isum is compared to an output current limit, Ilim. If Isum is less than or equal to Ilim, the amplifier output current is within tolerance and no action is necessary. When Isum exceeds Ilim, the current-representation of the input waveform Vin, which is fed to the control section of each output stage may be reduced, as shown at block 620. Reducing the control current to the output stages may reduce the amplifier output current and eliminate an over-current condition.

An exemplary application for the disclosed amplifier may be to drive a cooling fan in a personal computer. Efficient utilization of power may be of high importance to designers of personal computers and particularly to those designing portable computers powered from batteries. One well-known method of conserving power in computers is variable speed fan control. This method controls the speed of the cooling fan based on the temperature of the air within the computer, the operational mode of the processor, and/or other operational parameters such that more cooling air is forced through the computer when more heat is being generated by the internal components. If the fan is powered by a fixed-voltage supply capable of operating the fan at its maximum speed, then typically when it is desired to reduce the fan speed, some portion of the supply power is diverted from the fan and wasted as heat. If the fan spends the majority of its time operating at speeds less than maximum, then the efficiency of the fan's power supply my be less than desired.

The power supplies of personal computers generally provide several output voltage levels. The processor and associated digital components operate from low voltage levels that decrease as clock speeds increase. Peripheral devices such as disk drives, communications cards, and cooling devices may require power at higher voltages. The availability of a variety of supply voltages may allow for the implementation of a class G amplifier to provide power to a cooling fan. The disclosed class G amplifier may be implemented as an integrated circuit using CMOS technology to power a cooling fan using the several voltages available from the computer power supply. Since each output stage may supply power to the fan until the amplifier output voltage reaches the level of the supply associated with that output stage, as described above, the efficiency of powering the fan may be very high (90% or more) whenever the fan voltage is just below one of the supply voltages.

Although some examples of the disclosed amplifier have depicted a device with three output stages, it is noted that the same inventive features may be applied to amplifiers with any number of supply voltages and corresponding output stages greater than or equal to two. Numerous variations and modifications will become apparent to those skilled in the art once the above disclosure is fully appreciated. It is intended that the following claims be interpreted to embrace all such variations and modifications.

What is claimed is:

1. An amplifier, comprising:
   an input stage configured to receive an amplifier input signal;
   a plurality of output stages configured to combinatorially produce an amplifier output; and
   an output stage controller coupled to the input stage and the output stages;
   wherein each of the plurality of output stages is configured to receive a supply voltage that is different from any other output stage;
   wherein each of the plurality of output stages comprises an output transistor; and
   wherein in response to the amplifier input signal, the output stage controller is configured to generate control signals that cause each of the plurality of output stages to contribute current to the output of the amplifier when the output of the amplifier is less than the supply voltage received by the output stage.

2. The amplifier of claim 1 configured as a class G amplifier.

3. The amplifier of claim 1, wherein the maximum output voltage of the amplifier is equal to a highest supply voltage minus the product of the amplifier output current and Rdson for the output transistor comprised in the one of the plurality of output stages associated with the highest supply voltage.

4. The amplifier of claim 1, wherein the Rdson for the output transistors is inversely proportional to the channel width of the transistors.

5. The amplifier of claim 1, wherein the product of the amplifier output current and Rdson for the output transistor comprised in the one of the plurality of output stages associated with the highest supply voltage is approximately 0.15V.

6. The amplifier as recited in claim 1, wherein for each of the plurality of output stages except for the one of the plurality of output stages configured to receive a highest supply voltage, the output stage controller is configured to generate a control signal, which changes state in response to the amplifier output voltage reaching the voltage level of the supply voltage received by the output stage.

7. The amplifier as recited in claim 6, wherein each of the control signals controls an analog switch coupled between an input and output of the corresponding output stage, wherein if the amplifier output is increasing, the control signal is configured to close the analog switch, wherein if the amplifier output is decreasing, the control signal is configured to open the analog switch.

8. The amplifier as recited in claim 7, wherein when the analog switch is closed the output transistor comprised in the output stage is configured to inhibit current from flowing from the amplifier output into a power supply associated with the output stage.

9. The amplifier as recited in claim 7, wherein when the analog switch is open the output transistor comprised in the output stage is configured to allow current to flow from a power supply associated with the output stage to the amplifier output.

10. The amplifier as recited in claim 1 implemented as an integrated circuit using CMOS technology.

11. The amplifier as recited in claim 1 configured to drive a fan.

12. The amplifier as recited in claim 1, wherein each of the plurality of output stages is configured to provide a voltage gain greater than unity.

13. A class G amplifier, wherein when the amplifier output voltage is in a range between the supply voltage received by an output stage and a voltage differential, delta V, below said supply voltage, both that output stage and another output stage receiving a next higher supply voltage contribute current to the amplifier output.

14. The class G amplifier as recited in claim 13, wherein delta V is determined by the W/L ratio of transistors comprised in the output stage controller.

15. The class G amplifier as recited in claim 13, wherein delta V is in the range of 0V to 0.8V.

16. The class G amplifier as recited in claim 13, wherein delta V is approximately 0.3V.

17. A class G amplifier, wherein each of the plurality of output stages, except for an output stage configured to receive a lowest supply voltage, is configured to contribute current to the amplifier output when the amplifier output voltage is in a range from the supply voltage received by that output stage to a next lower supply voltage less a differential voltage, delta V.

18. The class G amplifier as recited in claim 17, wherein the output stage associated with the lowest supply voltage is configured to contribute current to the amplifier output when the amplifier output voltage is in a range from 0V, to the lowest supply voltage.

19. The class G amplifier as recited in claim 17, wherein delta V is in a range of 0V to approximately 0.8V.

20. The class G amplifier as recited in claim 17, wherein delta V is approximately 0.3V.

21. A method comprising:
   outputting current from an output stage associated with a lowest supply voltage when an amplifier output voltage is less than the lowest supply voltage;
   outputting current from an output stage associated with a highest supply voltage when the amplifier output voltage is greater than the next lower supply voltage minus delta V; and
   outputting current from an output stage associated with a supply voltage other than the lowest or highest supply voltage when the amplifier output voltage is between a next lower supply voltage minus delta V, and the supply voltage associated with that output stage.

22. The method of claim 21, wherein delta V is determined by the W/L ratio of transistors comprised in an output stage controller.

23. The method of claim 21, wherein delta V is in the range of 0V to 0.8V.

24. The method of claim 21, wherein delta V is approximately 0.3V.

25. The method of claim 21, wherein the number of output stages and corresponding supply voltages is greater than 3.

26. The method of claim 21, wherein the maximum output voltage of the amplifier is equal to a highest supply voltage minus the product of the amplifier output current and Rdson for the output transistor comprised in the one of the plurality of output stages associated with the highest supply voltage.

27. The method of claim 21, wherein the product of the amplifier output current and Rdson for the output transistor comprised in the one of the plurality of output stages associated with the highest supply voltage is approximately 0.15V.

28. The method of claim 21, further comprising isolating the output of each output stage from the amplifier output voltage when the amplifier output voltage is greater than the supply voltage associated with that output stage.

29. A method comprising:
   generating a first current that is inversely proportional to an output voltage of an amplifier;
   generating a second current that is directly proportional to a sum of currents output by the output stages of the amplifier;
   combining the first and second currents such that under normal amplifier operation the resulting current is constant and less than a limiting value, Ilim, for a range of output voltages for the amplifier.

30. The method of claim 29, wherein the combined first and second currents control a resistance between an input voltage of the amplifier and ground.

31. The method of claim 30, further comprising reducing the resistance between the input voltage of the amplifier and ground in response to the value of the combined first and second currents exceeding Ilim.

32. The method of claim 31, wherein the reduction in resistance between the input voltage of the amplifier and ground is proportional to the amount by which the combined first and second currents exceed Ilim.

* * * * *